United States Patent
Blawert et al.

(10) Patent No.: US 11,959,180 B2
(45) Date of Patent: Apr. 16, 2024

(54) ANTICORROSION COATING AND ARTICLE COATED WITH AN ANTICORROSION COATING, ESPECIALLY FOR USE IN AN AIRCRAFT

(71) Applicants: Airbus Operations GmbH, Hamburg (DE); Airbus Defence and Space GmbH, Taufkirchen (DE)

(72) Inventors: Carsten Blawert, Hamburg (DE); Florian Gehrig, Wismar (DE); Tillmann Doerr, Bremen (DE); Bettina Kröger-Kallies, Bremen (DE); Oliver Rohr, Ottobrunn (DE); Mikhail Zheludkevich, Hamburg (DE); Maria del Rosario Silva Campos, Hamburg (DE); Michael Störmer, Hamburg (DE)

(73) Assignees: Airbus Operations GmbH, Hamburg (DE); Airbus Defence and Space GmbH, Taufkirchen (DE)

( * ) Notice: Subject to any disclaimer, the term of this patent is extended or adjusted under 35 U.S.C. 154(b) by 0 days.

(21) Appl. No.: 17/203,288

(22) Filed: Mar. 16, 2021

(65) Prior Publication Data
US 2021/0292914 A1 Sep. 23, 2021

(30) Foreign Application Priority Data
Mar. 17, 2020 (DE) ..................... 10 2020 107 278.3

(51) Int. Cl.
C23F 13/14 (2006.01)
C22C 21/00 (2006.01)
C23C 14/16 (2006.01)

(52) U.S. Cl.
CPC ............. *C23F 13/14* (2013.01); *C22C 21/00* (2013.01); *C23C 14/165* (2013.01)

(58) Field of Classification Search
None
See application file for complete search history.

(56) References Cited

U.S. PATENT DOCUMENTS 4,211,827 A * 7/1980 Pryor ................... B23K 35/288
420/548
4,963,237 A 10/1990 Olds et al.
(Continued)

FOREIGN PATENT DOCUMENTS

CN 107 653 440 A 2/2018
CN 107653440 A * 2/2018 ............. C23C 14/16
(Continued)

OTHER PUBLICATIONS

German Search Report for Application No. 10 2020 107 278.3 dated Nov. 20, 2020.

*Primary Examiner* — Daniel J. Schleis
(74) *Attorney, Agent, or Firm* — KDW FIRM PLLC

(57) ABSTRACT

An anticorrosion coating and an article coated with an anticorrosion coating, especially for use in an aircraft, and a method of producing a coated article and a vehicle, especially an aircraft, including an anticorrosion coating or at least one such coated article. An anticorrosion coating includes an aluminum alloy having 0.03-0.5% by weight of tin. A coated article produced at least partly from a material and having at least partly been coated with the anticorrosion coating including an aluminum alloy having 0.03-0.5% by weight of tin. A method of producing the anticorrosion coating is also disclosed.

20 Claims, 2 Drawing Sheets

(56) References Cited

U.S. PATENT DOCUMENTS

| | | | |
|---|---|---|---|
| 5,744,255 A * | 4/1998 | Doko | B23K 35/286 |
| | | | 165/905 |
| 2013/0202815 A1 | 8/2013 | Hass et al. | |
| 2018/0274062 A1 * | 9/2018 | Allely | C23C 2/40 |

FOREIGN PATENT DOCUMENTS

| | | | | |
|---|---|---|---|---|
| CN | 109136864 A * | 1/2019 | | |
| DE | 29 28 303 A1 | 9/1980 | | |
| DE | 10 2017 111 531 B3 | 5/2018 | | |
| EP | 3423725 A1 * | 1/2019 | | F16C 17/02 |
| JP | 2016060945 A * | 4/2016 | | |

\* cited by examiner

ANTICORROSION COATING AND ARTICLE COATED WITH AN ANTICORROSION COATING, ESPECIALLY FOR USE IN AN AIRCRAFT

CROSS-REFERENCE TO RELATED APPLICATION

This application claims priority to German Patent Application Serial No. 10 2020 107 278.3 filed Mar. 17, 2020, the entire disclosure of which is incorporated by reference herein.

TECHNICAL FIELD

The disclosure herein relates to an anticorrosion coating and to an article coated with an anticorrosion coating, especially for use in an aircraft, to a method of producing a coated article and to a vehicle and especially an aircraft comprising such an anticorrosion coating or at least one such coated article.

BACKGROUND

Cadmium layers have been used in aviation for decades for a wide variety of different applications and components, especially made of steel, since cadmium has good corrosion resistance and sacrificial anodic protective action with respect to various substrates, especially iron-containing substrates, for example steel, and additionally has galvanic compatibility with a fuselage manufactured from an aluminum alloy, high electrical conductivity, good weld- and solderability, and additionally a certain lubricating action. Connecting elements, structural parts or electrical parts such as plug connectors or the like could typically have a cadmium coating. It is particularly common here to use a galvanically deposited cadmium layer with subsequent Cr(VI)-based passivation. However, the use of cadmium may be restricted by future regulations.

There is currently no known coating that achieves the good technical properties of cadmium for universal use in aircraft. In general, the sacrificial anodic protective action of cadmium, especially with respect to iron-containing substrates, for example steel, is a fundamental function that must also be fulfilled by alternative coatings. In recent years, some coatings for replacement of cadmium have been examined, which especially comprise zinc- and aluminum-based coatings or metal-filled organic or inorganic coatings, for example zinc flake coatings or aluminum-pigmented coatings. Galvanically deposited zinc-nickel (ZnNi) layers having a nickel content of about 10% to 15% tend to be the most suitable here. However, it is not possible to cover all aviation applications with ZnNi layers. Moreover, it is favourable to limit the use of nickel compounds as far as possible.

It is known that an aluminum coating can be applied to components by ion vapor deposition (IVD) methods, in order to replace cadmium. However, this coating is subject to significant self-passivation of the aluminum, such that it is not possible to coat all relevant components with IVD aluminum. PVD processes and especially magnetron sputtering are known ways of applying aluminum alloys to surfaces. However, the columnar growth of the layers can have an adverse effect since it leads to high porosity and hence to elevated wear. Galvanic deposition methods are likewise known.

SUMMARY

It is an object of the subject matter herein to disclose an anticorrosion coating for articles, especially for metallic articles, for example an iron-containing article or an article made of a steel, which acts as sacrificial anode for corrosion protection, has particularly low wear, is inexpensive and applicable in a low layer thickness, and is additionally free of cadmium. It is a further object of the disclosure herein to provide an article coated with the anticorrosion coating and a method of producing such an article coated with the anticorrosion coating.

This object is achieved by the anticorrosion coating having features disclosed herein and by the coated article and a method disclosed herein. Advantageous embodiments and developments can be found in the subsidiary claims and the description that follows.

DETAILED DESCRIPTION

Figure 1:
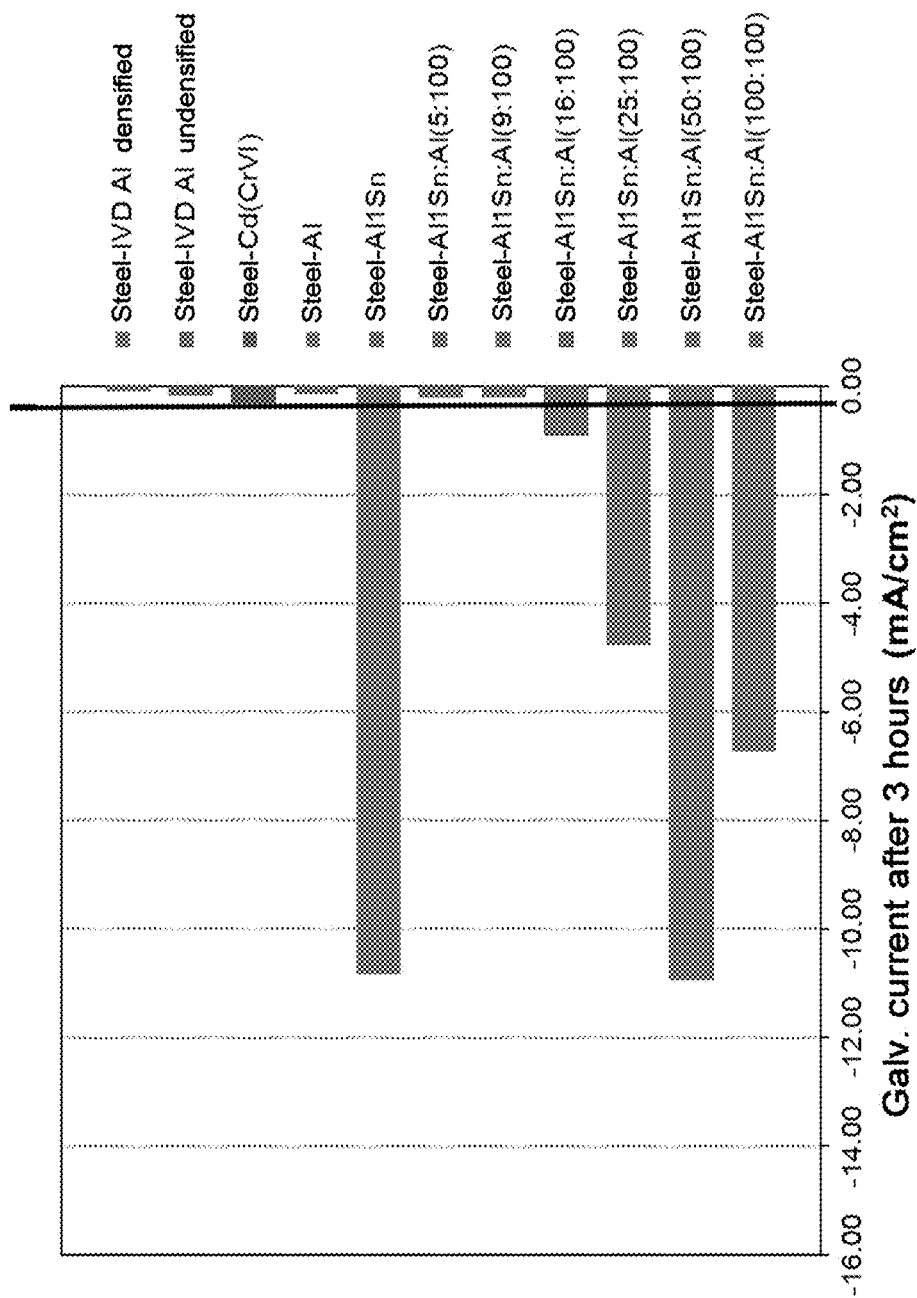
FIG. 1 is a diagram for illustration of the galvanic current measured for various uncoated and coated substrates after immersion in Harrison's solution (0.05% NaCl+0.35% $(NH_4)_2SO_4$) for three hours.
Figure 2:
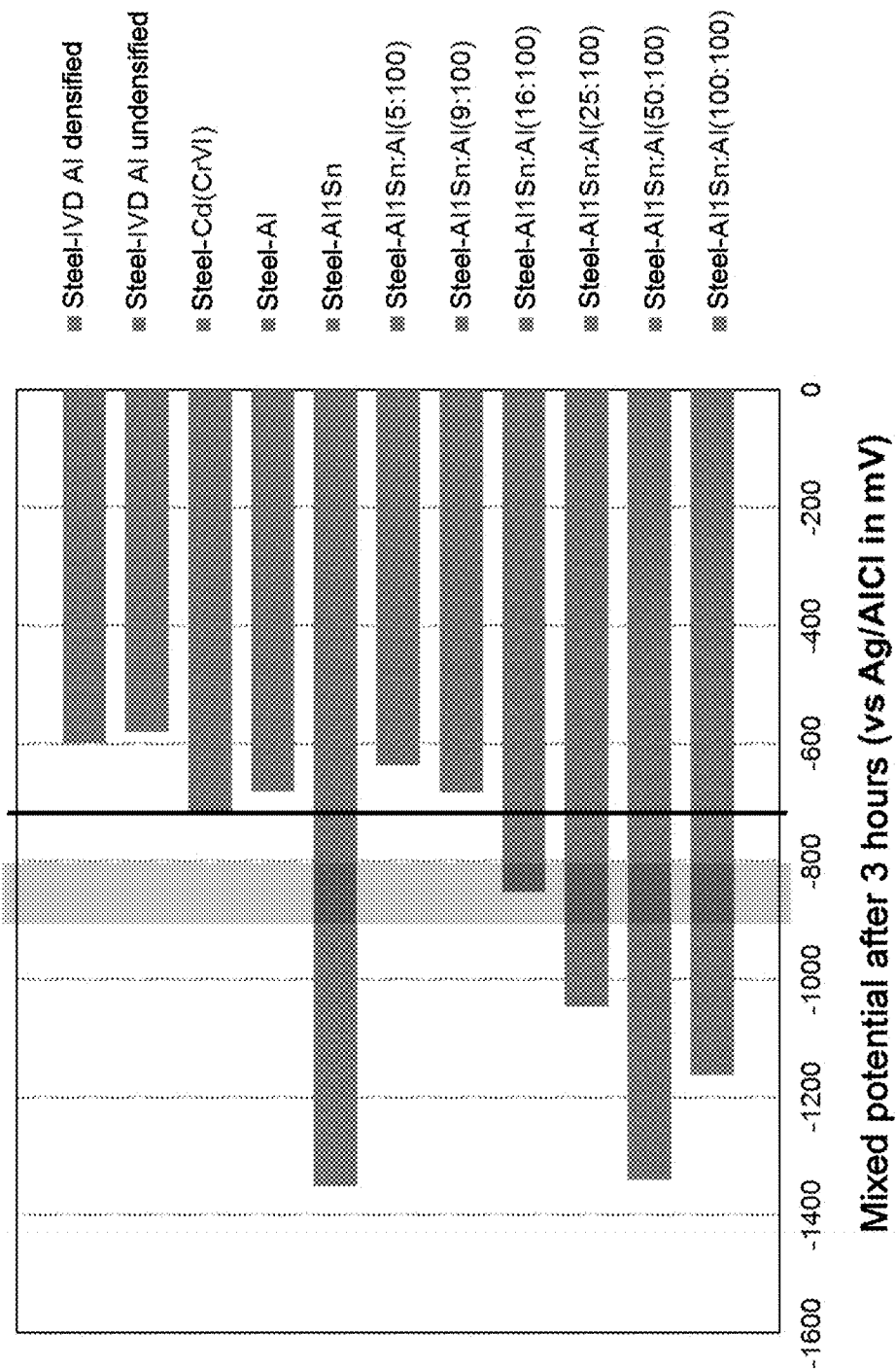
FIG. 2 is a diagram for illustration of the mixed potential measured for various uncoated and coated substrates after immersion in Harrison's solution (0.05% NaCl+0.35% $(NH_4)_2SO_4$) for three hours.

An anticorrosion coating is disclosed, comprising an aluminum alloy comprising 0.03-0.5% by weight of tin (Sn). In a preferred embodiment, the anticorrosion coating consists of the aluminum alloy described herein.

The use of an aluminum alloy in the anticorrosion coating is favourable since aluminum has a low electrode potential. For example, the electrode potential of aluminum is generally lower than that of iron-containing materials, for example steel, that are potential and preferred substrates coatable with the anticorrosion coating. The coating acts as sacrificial anode and cathodically protects the substrate coated therewith or the article coated therewith. The coating is consequently gradually dissolved and hence protects the substrate beneath, for example an iron-containing material such as steel. A suitable composition of the aluminum alloy can minimize the degree of dissolution of the aluminum alloy, such that the anticorrosion effect of the anticorrosion coating is sufficiently prolonged.

However, a pure aluminum coating has a tendency to passivation as a result of formation of an aluminum oxide layer at the surface of the aluminum coating. The aluminum oxide layer protects the aluminum beneath, such that aluminum, which is intrinsically a base metal owing to its low electrode potential, is protected from dissolution. In order to prevent excessive passivation of the aluminum, or to suppress the passivation of aluminum at least to such an extent that the aluminum is available for cathodic protection of the article coated therewith, the aluminum alloy in the anticorrosion coating according to the disclosure herein comprises tin (Sn) as a further alloy constituent. At the same time, however, a certain passivation of the aluminum alloy is indeed also desirable since this prevents excessively rapid consumption of the anticorrosion coating and hence contributes to a longer service life of the anticorrosion coating.

The aluminum alloy in the anticorrosion coating according to the disclosure herein comprises 0.03-0.5% by weight of tin (Sn), based on the total weight of the aluminum alloy. The aluminum alloy in the anticorrosion coating according to the disclosure herein preferably comprises 0.045-0.35% by weight of tin, for example 0.1-0.3% by weight of tin or 0.1-0.2% by weight of tin, based in each case on the total weight of the aluminum alloy. Even more preferably, the aluminum alloy in the anticorrosion coating according to the disclosure herein comprises 0.13-0.19% by weight of tin, for example 0.13-0.17% by weight of tin or 0.13-0.16% by weight of tin, based in each case on the total weight of the aluminum alloy. Especially preferably, the aluminum alloy in the anticorrosion coating according to the disclosure herein comprises 0.13-0.15% by weight of tin, based on the total weight of the aluminum alloy.

It has been found that, surprisingly, the use of tin, even in the amount specified, in the aluminum alloy has the effect that this prevents or sufficiently strongly suppresses complete passivation of the aluminum. At the same time, it has likewise been found that, surprisingly, this amount of tin also ensures that the corrosion of the aluminum coating is not too rapid and, therefore, the anticorrosion effect of the aluminum alloy of the disclosure herein on a substrate, for example an iron-containing substrate such as steel, is sufficiently prolonged. These properties and especially the prevention of passivation may be assured under conditions that occur in the case of use in an aircraft, especially under aviation conditions, i.e. in an absolute pressure range from about 0.25 to about 1 bar and for a temperature range of about −50° C. to about 60° C.

The aluminum alloy in the anticorrosion coating according to the disclosure herein may comprise further alloy constituents. These further alloy constituents are preferably selected from manganese (Mn), silicon (Si), zinc (Zn), gallium (Ga), magnesium (Mg), chromium (Cr), iron (Fe), titanium (Ti), indium (In), bismuth (Bi), selenium (Se), copper (Cu), zirconium (Zr), antimony (Sb), cobalt (Co) and combinations thereof. These elements may be utilized for establishment of a resultant electrochemical potential of the aluminum alloy which is similar to that of cadmium, since each of these elements is capable in principle of shifting the electrochemical potential of pure aluminum to even more strongly electronegative values. Moreover, addition of these further alloy constituents can also develop a more uniform anticorrosion coating, which can lead, for example, to more uniform consumption of the sacrificial anode. For this purpose, in particular, it is advantageously possible to use manganese (Mn), zinc (Zn) and magnesium (Mg). Aluminum alloys having a manganese content are notable for particularly high corrosion resistance. Silicon can be utilized for reduction of the melting point of aluminum alloys and can thus improve the operation of coating a substrate with the aluminum alloy of the disclosure herein. Zinc generally improves the anticorrosion properties of an aluminum alloy. It is particularly advantageous and preferable to use zinc (Zn) as an additional alloy constituent of the aluminum alloy described.

The aluminum alloy in the anticorrosion coating according to the disclosure herein may comprise each of the abovementioned additional alloy constituents of manganese (Mn), silicon (Si), gallium (Ga), magnesium (Mg), chromium (Cr), iron (Fe), titanium (Ti), indium (In), bismuth (Bi), selenium (Se), copper (Cu), zirconium (Zr), antimony (Sb), cobalt (Co), for example, in an amount of up to 2% by weight, preferably 1% by weight, even more preferably in an amount of 0.5% by weight, for example in an amount of 0.01-0.3% by weight or of 0.05% to 0.2% by weight, based in each case on the total weight of the aluminum alloy.

Alternatively or additionally to the additional alloy constituents of manganese (Mn), silicon (Si), gallium (Ga), magnesium (Mg), chromium (Cr), iron (Fe), titanium (Ti), indium (In), bismuth (Bi), selenium (Se), copper (Cu), zirconium (Zr), antimony (Sb), cobalt (Co), in the amounts described herein, the aluminum alloy in the anticorrosion coating according to the disclosure herein may comprise the abovementioned additional alloy constituent of zinc (Zn) in an amount of up to 10% by weight, preferably up to 7% by weight, for example of 1% to 5% by weight, preferably of 2% to 4% by weight, based in each case on the total weight of the aluminum alloy.

In a preferred embodiment, the aluminum alloy in the anticorrosion coating according to the disclosure herein comprises, as additional alloy constituent, only zinc (Zn) in an amount of up to 10% by weight, preferably up to 7% by weight, for example of 1% to 5% by weight, preferably of 2% to 4% by weight, based in each case on the total weight of the aluminum alloy.

The total amount of the additional alloy constituents in the aluminum alloy in the anticorrosion coating according to the disclosure herein may be up to 20% by weight, preferably up to 10% by weight, even more preferably up to 7% by weight, for example of 1% to 5% by weight, preferably of 2% to 4% by weight, based in each case on the total weight of the aluminum alloy.

The aluminum alloy in the anticorrosion coating according to the disclosure herein comprises, as the main constituent or as the balance, aluminum and unavoidable impurities. Unavoidable impurities may be present in the aluminum alloy, for example, in a total amount of up to 0.5% by weight, for example up to 0.1% or up to 0.05% by weight or up to 0.01% by weight or preferably up to 0.001% by weight, based in each case on the total weight of the aluminum alloy.

The aluminum alloy in the anticorrosion coating according to the disclosure herein preferably does not comprise any cadmium and is more preferably entirely free of cadmium, i.e. cadmium is not even present as an unavoidable impurity.

In one embodiment, the aluminum alloy in the anticorrosion coating according to the disclosure herein consists of tin (Sn) in the amounts described herein, optionally further alloy constituents selected from manganese (Mn), silicon (Si), zinc (Zn), gallium (Ga), magnesium (Mg), chromium (Cr), iron (Fe), titanium (Ti), indium (In), bismuth (Bi), selenium (Se), copper (Cu), zirconium (Zr), antimony (Sb), cobalt (Co) and combinations thereof in the amounts described herein and, as the main constituent or as the balance, aluminum and unavoidable impurities in the amounts described herein. In one embodiment, the aluminum alloy in the anticorrosion coating according to the disclosure herein consists of tin (Sn) in the amounts described herein, optionally further alloy constituents selected from manganese (Mn), silicon (Si), zinc (Zn), magnesium (Mg) and combinations thereof in the amounts described herein and, as the main constituent or as the balance, aluminum and unavoidable impurities in the amounts described herein.

In one embodiment, the aluminum alloy in the anticorrosion coating according to the disclosure herein consists of tin (Sn) and zinc (Zn), each in the amounts described herein, optionally further alloy constituents selected from manganese (Mn), silicon (Si), magnesium (Mg) and combinations thereof in the amounts described herein and, as the main constituent or as the balance, aluminum and unavoidable impurities in the amounts described herein.

In one embodiment, the aluminum alloy in the anticorrosion coating according to the disclosure herein consists of tin (Sn) in the amounts described herein, optionally zinc (Zn) as a further alloy constituent in the amounts described herein and, as the main constituent or as the balance, aluminum and unavoidable impurities in the amounts described herein.

In a further-preferred embodiment, the aluminum alloy consists of 0.03-0.5% by weight of tin, preferably 0.045-0.35% by weight of tin, for example 0.1-0.3% by weight of tin or 0.1-0.2% by weight of tin, based in each case on the total weight of the aluminum alloy, and the balance of aluminum (Al) and unavoidable impurities. The unavoidable impurities may be present in the aluminum alloy in the amounts described herein.

In a particularly preferred embodiment, the aluminum alloy consists of 0.13-0.19% by weight of tin, for example 0.13-0.15% by weight of tin, based in each case on the total weight of the aluminum alloy, and the balance of aluminum (Al) and unavoidable impurities. The unavoidable impurities may be present in the aluminum alloy in the amounts described herein.

The aluminum alloy in the anticorrosion coating according to the disclosure herein has the advantage that it does not show excessive passivation which is disadvantageous for use as a sacrificial anode, and that its electrochemical properties are additionally similar to those of the cadmium-containing protective layers that are currently in use.

The anticorrosion coating of the disclosure herein preferably has a thickness of 0.1 to 100 μm, more preferably of 1 to 50 μm, even more preferably of 5 to 25 μm and especially preferably of 7 to 20 μm. For example, the anticorrosion coating of the disclosure herein may have a thickness of either 10 to 20 μm or 7 to 10 μm. Such a thickness of the anticorrosion coating has been found to be advantageous since this can firstly minimize the total demand for anticorrosion coating, and can secondly achieve a good and sufficiently long anticorrosion effect, and the anticorrosion coating additionally does not have an adverse effect on the total weight of the coated article.

The anticorrosion coating of the disclosure herein is further preferably suitable for application by a vacuum deposition method to a substrate, for example an iron-containing article, for example a steel. For example, the anticorrosion coating of the disclosure herein is suitable for application by sputtering techniques or an IVD (ion vapor deposition) method. The advantage of these application techniques is that this can achieve particularly uniform and homogeneous and additionally very thin application of layers. Both sputtering techniques and IVD methods are well known to the person skilled in the art.

Also disclosed is a coated article, wherein the article has been produced at least partly from a material, and has been coated at least partly with the anticorrosion coating described herein. The article is also referred to synonymously herein as substrate. The article has preferably been produced from a single material and/or coated completely with the anticorrosion coating of the disclosure herein. The article has more preferably been produced from a single material and coated completely with the anticorrosion coating of the disclosure herein.

The material coatable with the anticorrosion coating according to the disclosure herein is not restricted and may include all possible metals or alloys, for example iron and iron alloys, steels, titanium and titanium alloys, copper and copper alloys, nickel and nickel alloys, aluminum and aluminum alloys, etc.

In a preferred embodiment of the disclosure herein, the article that has been coated at least partly, preferably fully, with the anticorrosion coating of the disclosure herein has been produced from a material containing iron. The material may, for example, be iron, for example cast iron or wrought iron, or any known iron-containing alloy, for example iron-containing alloys approved for aerospace.

In a particularly preferred embodiment of the disclosure herein, the iron-containing material from which the article that has been coated at least partly, preferably fully, with the anticorrosion coating of the disclosure herein has been produced is steel. Useful examples are all commercially available steels. Preference is given to those steels that are approved for use in aerospace, for example the steels from the materials group of "specialty aerospace steels" or the alloys that are known to the person skilled in the art with the designations 1.7734, 1.6604, 1.6944, 1.7214, 1.1174, 35NCD16, 15-5PH, 17-4PH, 17-7PH, 13-8PH, 1.4544, 1.4944, 1.4044, 1.4304, 1.4541, 1.4544. Particular preference is given to 1.7734 steel. 1.7734 steel contains 0.12-0.18% by weight of carbon (C), 0.8-1.1% by weight of manganese (Mn), ≤0.20% by weight of silicon (Si), 0.02% by weight of phosphorus (P), 0.015% by weight of sulfur (S), 1.25-1.5% by weight of chromium (Cr), 0.8-1.0% by weight of molybdenum (Mo) and 0.20-0.30% by weight of vanadium (V).

The anticorrosion coating according to the disclosure herein on the coated article according to the disclosure herein may have a thickness of 0.1 to 100 μm, preferably of 1 to 50 μm, more preferably of 5 to 25 μm and especially preferably of 7 to 20 μm, for example either of 10 to 20 μm or of 7 to 10 μm.

In a preferred embodiment, the anticorrosion coating of the disclosure herein has been applied to the coated article of the disclosure herein with the aid of a sputtering technique or an IVD (ion vapor deposition) method.

The disclosure herein further provides a method of producing a coated article described herein. The method according to the disclosure herein comprises the steps of providing an article, and at least partly, preferably fully, coating the substrate with the anticorrosion coating as described herein, and preferably with the aluminum alloy described herein.

In a preferred embodiment of the method of the disclosure herein, the substrate, preferably an article made of an iron-containing alloy, for example steel, can be coated with the anticorrosion coating with the aid of sputtering techniques, for example using a magnetron, preferably with the aid of a co-sputtering technique. These application techniques are well known to those skilled in the art and therefore do not require any more detailed elucidation. It is likewise known to the person skilled in the art that, in what is called the co-sputtering technique, the substrate is simultaneously sputtered with two sputtering targets made of two different alloys or else pure substances or pure metals in particular mass ratios. This enables the application of defined compositions or alloys using two different sputtering targets. The advantage of this technique is that this enables the use, for example, of readily commercially available sputtering targets.

The disclosure herein further provides for the use of an aluminum alloy comprising 0.03% to 0.5% by weight of tin, preferably 0.1-0.35% by weight of tin, more preferably 0.13-0.19% by weight of tin and especially preferably 0.13-0.15% by weight of tin, for production of an anticorrosion coating for an iron-containing article. In the use according to the disclosure herein, preference is given here to the aluminum alloy described herein. It is further preferable that the iron-containing article is a steel. The iron-containing article may be an iron-containing article described herein.

The disclosure herein further provides a vehicle, preferably aircraft, comprising an anticorrosion coating described herein or a coated article as described herein.

Especially for aerospace applications, galvanic compatibility of coated connecting elements, for instance, with respect to the material of the components to be connected is an important prerequisite. The coated article may, for instance, be a connecting element which is utilized for securing to a component including an aluminum alloy. This component may, for instance, be part of a fuselage made of an aluminum alloy.

The article coated with the anticorrosion coating, or the substrate, is preferably an iron-containing material, for example steel. The cadmium-free anticorrosion coating of the disclosure herein can especially endow different components of an aircraft with corrosion resistance. These include securing elements, clevises, bushings, washers and spacers and numerous other elements.

It should additionally be pointed out that features that have been described with reference to one of the above working examples can also be used in combination with other features of other working examples described above.

EXAMPLES

Further features, advantages and possible uses of the disclosure herein are apparent from the examples that follow. However, these examples are not intended to restrict the scope of the disclosure herein, but serve merely for better illustration of individual subjects and advantages of the disclosure herein.

Example 1

Silicon wafers were coated with various aluminum alloys by magnetron sputtering. This was done using a co-sputtering technique using pure aluminum and AlISn as sputtering targets. This means that the substrate was sputtered simultaneously with two targets of pure aluminum and AlISn in various mass ratios.

Aluminum alloys were applied as pure AlISn and in the following power ratios (or sputtering ratios) of the sputtering targets: AlISn-aluminum (100:100), AlISn-aluminum (50:100), AlISn-aluminum (Al) (25:100), AlISn-aluminum (16:100), AlISn-aluminum (9:100), AlISn-aluminum (5:100). For example, AlISn—Al (16:100) means that an AlISn alloy and aluminum (Al) were applied by co-sputtering in a sputtering ratio of 16:100. This corresponds to an amount (in % by weight) of tin (Sn) theoretically present in the layers of 0.5% by weight of Sn for AlISn—Al (100:100), of 0.33% by weight of Sn for AlISn—Al (50:100), of 0.20% by weight of Sn for AlISn—Al (25:100), of 0.138% by weight of Sn for AlISn—Al (16:100), of 0.083% by weight of Sn for AlISn—Al (9:100) and of 0.048% by weight of Sn for AlISn—Al (5:100).

The galvanic current between steel (1.7734.5) and the various coatings of the aluminum alloys on the silicon wafers was measured after immersion in Harrison's solution (0.05% NaCl+0.35% $(NH_4)_2SO_4$) for three hours. Harrison's solution is a typical solution used in anticorrosion tests. The steel surface area was 0.01 $cm^2$, and the surface area of the coatings of aluminum alloys 0.5 $cm^2$. The aluminum alloys on silicon wafers were produced as in Example 1. In addition, a sample with a customary cadmium-based anticorrosion layer (Cd+chromation) and samples with layers of aluminum (Al) only were examined.

FIG. 1 (FIG. 1) shows the galvanic current measured for various uncoated and coated substrates, which is a measure of galvanic corrosion. AlISn and AlISn—Al (50:100) coatings show similar and quite high galvanic corrosion. This can lead to defects or more active dissolution even after a relatively short time. Lower currents are exhibited by AlISn—Al (100:100) and AlISn—Al (25:100). Similar currents are exhibited by Cd(CrVI), Al, AlISn—Al (5:100) and AlISn—Al (9:100). AlISn—Al (16:100) has a slightly elevated current compared to Cd(CrVI). In the case of IVD Al, densified by blasting with glass beads or in undensified form, the galvanic current is very low. The strength of the galvanic current is an indicator as to how quickly a corresponding sacrificial anode is dissolved, i.e. consumed. In principle, for many applications, currents that are more preferred are those that are within the range of the current measured for the cadmium-containing anticorrosion layer that is typically used nowadays.

Example 2

The mixed potential between steel (1.7734.5) and various coatings of aluminum alloys on silicon wafers was measured after immersion in Harrison's solution (0.05% NaCl+0.35% $(NH_4)_2SO_4$) for three hours. Harrison's solution is a typical solution used in anticorrosion tests. The reference electrode used was an Ag/AgCl electrode. The steel surface area was 0.01 $cm^2$, and the surface area of the coatings of aluminum alloys 0.5 $cm^2$. The aluminum alloys on silicon wafers were produced as in Example 1. In addition, a sample with a customary cadmium-based anticorrosion layer (Cd+chromation) and samples with layers of aluminum (Al) only were examined.

In order to effectively protect steel from corrosion in Harrison's solution, what is required is a potential with a value of around −730 mV Ag/AgCl, i.e. the value measured for a customary cadmium-containing anticorrosion coating (Cd(CrVI)), or more. For some applications, for example for effective corrosion protection in a medium with a relatively high chloride concentration, for example a concentration corresponding to the chloride concentration in seawater, what is required is a mixed potential value of about −800 up to −900 mV. A significantly higher mixed potential can lead to unnecessary consumption of the sacrificial anode, which is less desirable in some applications. The potential of the AlISn—Al (16:100) coating is just above −800 mV and hence has a mixed potential within the range mentioned above as being particularly desirable.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An anticorrosion coating comprising an aluminum alloy consisting of 0.13-0.19% by weight tin, 2% to 4% by weight zinc, each up to 1% by weight of alloying components selected from manganese, silicon, gallium, magnesium, chromium, iron, titanium, indium, bismuth, selenium, copper, zirconium, antimony, and cobalt, and a balance of the aluminum alloy being aluminum and unavoidable impurities, wherein the anticorrosion coating has a thickness of 7 μm to 20 μm.

2. The anticorrosion coating according to claim 1, wherein the tin is in a range of 0.13-0.15% by weight.

3. The anticorrosion coating according to claim 1, wherein the aluminum alloy consists of 0.13-0.19% by weight tin, 2% to 4% by weight zinc, and the balance being aluminum and unavoidable impurities.

4. The anticorrosion coating according to claim 1, wherein the aluminum alloy consists of 0.13-0.15% by weight tin, 2% to 4% by weight zinc, and the balance being aluminum and unavoidable impurities.

5. The anticorrosion coating according to claim 1, wherein the anticorrosion coating is applied to a substrate by a vacuum deposition method.

6. A vehicle comprising the anticorrosion coating according to claim 1.

7. The anticorrosion coating according to claim 1, wherein the alloying components selected from manganese, silicon, gallium, magnesium, chromium, iron, titanium, indium, bismuth, selenium, copper, zirconium, antimony, and cobalt are each in an amount of up to 0.5% by weight.

8. The anticorrosion coating according to claim 1, wherein the alloying components selected from manganese, silicon, gallium, magnesium, chromium, iron, titanium, indium, bismuth, selenium, copper, zirconium, antimony, and cobalt are each in an amount of 0.05% to 0.2% by weight.

9. A coated article produced at least partly from a material and coated at least partly with an anticorrosion coating comprising an aluminum alloy consisting of 0.13-0.19% by weight tin, 2% to 4% by weight zinc, each up to 1% by weight of alloying components selected from manganese, silicon, gallium, magnesium, chromium, iron, titanium, indium, bismuth, selenium, copper, zirconium, antimony, and cobalt, and a balance of the aluminum alloy being aluminum and unavoidable impurities, wherein the anticorrosion coating has a thickness of 7 μm to 20 μm.

10. The coated article according to claim 9, wherein the material contains iron.

11. The coated article according to claim 9, wherein the material is steel.

12. The coated article according to claim 9, wherein the coated article is fully coated with the anticorrosion coating.

13. The coated article according to claim 9, wherein the anticorrosion coating is applied by a sputtering technique or an ion vapor deposition (IVD) method.

14. A vehicle comprising the coated article according to claim 9.

15. The coated article according to claim 9, wherein the alloying components selected from manganese, silicon, gallium, magnesium, chromium, iron, titanium, indium, bismuth, selenium, copper, zirconium, antimony, and cobalt are each in an amount of up to 0.5% by weight.

16. The coated article according to claim 9, wherein the alloying components selected from manganese, silicon, gallium, magnesium, chromium, iron, titanium, indium, bismuth, selenium, copper, zirconium, antimony, and cobalt are each in an amount of 0.05% to 0.2% by weight.

17. A method of producing a coated article, the method comprising:
providing an article; and
at least partly or fully coating the article with the anticorrosion coating comprising an aluminum alloy consisting of 0.13-0.19% by weight tin, 2% to 4% weight zinc, each up to 1% by weight of alloying components selected from manganese, silicon, gallium, magnesium, chromium, iron, titanium, indium, bismuth, selenium, copper, zirconium, antimony, and cobalt, and a balance of the aluminum alloy being aluminum and unavoidable impurities;
wherein the anticorrosion coating has a thickness of 7 μm to 20 μm.

18. The method according to claim 17, wherein coating the article with the anticorrosion coating comprises using a sputtering technique or a co-sputtering technique.

19. The method according to claim 17, wherein the alloying components selected from manganese, silicon, gallium, magnesium, chromium, iron, titanium, indium, bismuth, selenium, copper, zirconium, antimony, and cobalt are each in an amount of up to 0.5% by weight.

20. The method according to claim 17, wherein the alloying components selected from manganese, silicon, gallium, magnesium, chromium, iron, titanium, indium, bismuth, selenium, copper, zirconium, antimony, and cobalt are each in an amount of 0.05% to 0.2% by weight.

* * * * *